United States Patent
Dase

(10) Patent No.: US 11,150,290 B2
(45) Date of Patent: Oct. 19, 2021

(54) ACCURATE FAULT LOCATION METHOD BASED ON LOCAL AND REMOTE VOLTAGES AND CURRENTS

(71) Applicant: Schweitzer Engineering Laboratories, Inc., Pullman, WA (US)

(72) Inventor: Kanchanrao Gangadhar Dase, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 215 days.

(21) Appl. No.: 16/110,225

(22) Filed: Aug. 23, 2018

(65) Prior Publication Data

US 2020/0064392 A1 Feb. 27, 2020

(51) Int. Cl.
*G01R 31/08* (2020.01)
(52) U.S. Cl.
CPC ......... *G01R 31/088* (2013.01); *G01R 31/085* (2013.01)
(58) Field of Classification Search
None
See application file for complete search history.

(56) References Cited

U.S. PATENT DOCUMENTS

| | | | |
|---|---|---|---|
| 10,656,197 B2 | 5/2020 | Dase | |
| 2004/0245994 A1* | 12/2004 | Schlapp | G01R 31/11 324/500 |
| 2010/0102824 A1* | 4/2010 | Tremblay | G01R 31/088 324/522 |
| 2010/0277181 A1 | 11/2010 | Saha | |
| 2011/0184673 A1 | 7/2011 | Takani | |
| 2012/0068717 A1* | 3/2012 | Gong | G01R 31/085 324/522 |
| 2013/0262012 A1* | 10/2013 | O'Sullivan | H02J 13/0079 702/104 |
| 2017/0102426 A1* | 4/2017 | Schweitzer, III | G01R 31/086 |
| 2017/0315168 A1 | 11/2017 | Benmouyal | |

OTHER PUBLICATIONS

Karl Zimmerman and David Costello, "Impedance-Based Fault Location Experience," proceedings of the 58th Annual Conference for Protective Relay Engineers, College Station, TX, Apr. 2005.
H. Miller, J. Burger, N. Fischer and B. Kasztenny, "Modem Line Current Differential Protection Solutions,," proceedings of the 36th Annual Western Protective Relay Conference, Spokane, WA, Oct. 2009.
M. M. Saha, J. Izykowski, and E. Rosolowski, "Two-end and Multi-end Fault-location Algorithms," Fault Location on Power Networks. Springer, London, NY, 2010, pp. 306-309.

(Continued)

*Primary Examiner* — Nasima Monsur
(74) *Attorney, Agent, or Firm* — Bradley W. Schield

(57) ABSTRACT

A technique includes determining an approximate location of the fault based at least in part on a local current measurement and a local voltage measurement from a local relay and a remote current measurement and a remote voltage measurement from a remote relay. The technique includes determining a corrected location of the fault based on the approximate fault location and a correction factor. The correction factor is based on a propagation constant of the power line.

20 Claims, 8 Drawing Sheets

(56) References Cited

OTHER PUBLICATIONS

Aggarwal, et Al. "A Practical Approach to Accurate Fault Location on Extra High Voltage Teed Feeders", IEEE Transactions on Power Delivery, vol. 8, No. 3, Jul. 1993.

Gong, et Al. "Automated Fault Location System for Nonhomogeneous Transmission Networks", Presented at the 2012 Texas A&M Conference for Protective Relay Engineers. IEEE. Feb. 2012.

Izykowski, et Al. "A Fault-Location Method for Application With Current Differential Relays of Three-Terminal Lines", IEEE Transactions on Power Delivery, vol. 22. No. 4, Oct. 2007.

Izykowski, et Al "Accurate Location of Faults in Parrallel Transmission Lines Under Availability of Measurements from One Circuit Only", 14th PSCC, Sevilla, Jun. 2002.

Izykowski, et Al "Accurate Location of Faults of Faults on Power Transmission Lines With Use of Two-End Unsynchronized Measurements", IEEE Transactions on Power Delivery, vol. 21, No. 2, Apr. 2006.

Izykowski, et Al "Accurate Noniterative Fault Location Algorithm Utilizing Two-End Unsynchronized Measurements", IEEE Transactions on Power Delivery , vol. 25, No. 1, Jan. 2010.

Izykowski, et Al "Fundamental Frequency Equivalenting of Series Capacitors with MOVs in a Series-Compensated Line Under Fault Conditions", Dec. 2000.

Saha, et AL "Review of Fault Location Techniques for Distribution Systems", Power Systems and Communcations Infastructures for the Future, Beijing, Sep. 2002.

Saha, et AL "ATP-EMTP Investigation of a New Distance Protection Principle for Series Compensated Lines", International Conference on Power Systems Transients, New Orleans, USA, 2003.

M. Claus and J. Holbach, "Precise distance to fault locator with two end phasor measurement transmitted via serial protection data interface," 2007 Power Systems Conference: Advanced Metering, Protection, Control, Communication, and Distributed Resouices, Clemson, SC, Mar. 2007, pp. 106-111.

M. M. Saha, J. Izykowski, and E. Rosolowski, "Use of Two-end Synchronized Measurements," Fault Location on Power Networks. Springer, London, NY, 2010, pp. 264-265.

\* cited by examiner

US 11,150,290 B2

ACCURATE FAULT LOCATION METHOD BASED ON LOCAL AND REMOTE VOLTAGES AND CURRENTS

TECHNICAL FIELD

The present disclosure relates generally to electric power delivery systems and, more particularly, to detecting and locating faults on power lines.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines may be used to provide electrical energy from a source (such as, for example, a utility source, a generator, a distributed generator, or the like) to one or more loads. To conduct electricity between the source and the loads, power lines may include one or more conductors that are installed on overhead structures or buried underground. Due to aging and/or environmental conditions, such as wind, rain, animals, or vehicles, faults on power lines may occur in which power may not be delivered to the loads as desired.

Relays, faulted circuit indicators, and other electronic devices may be used to determine the location of the fault. The location of the fault may be used in various ways during operation of the power system. For example, the location of the fault may be sent to a control monitoring station to be displayed on a display to allow operators to diagnose the cause of the fault and to perform maintenance on the power line at the location. In this example, by determining an accurate location of the fault, the power line may be brought back on-line faster than if an accurate location was not determined, thereby allowing power may be delivered to loads in a more reliable manner (i.e., with less downtime). As such, it is desirable to determine accurate locations of faults on power lines.

Figure 1:
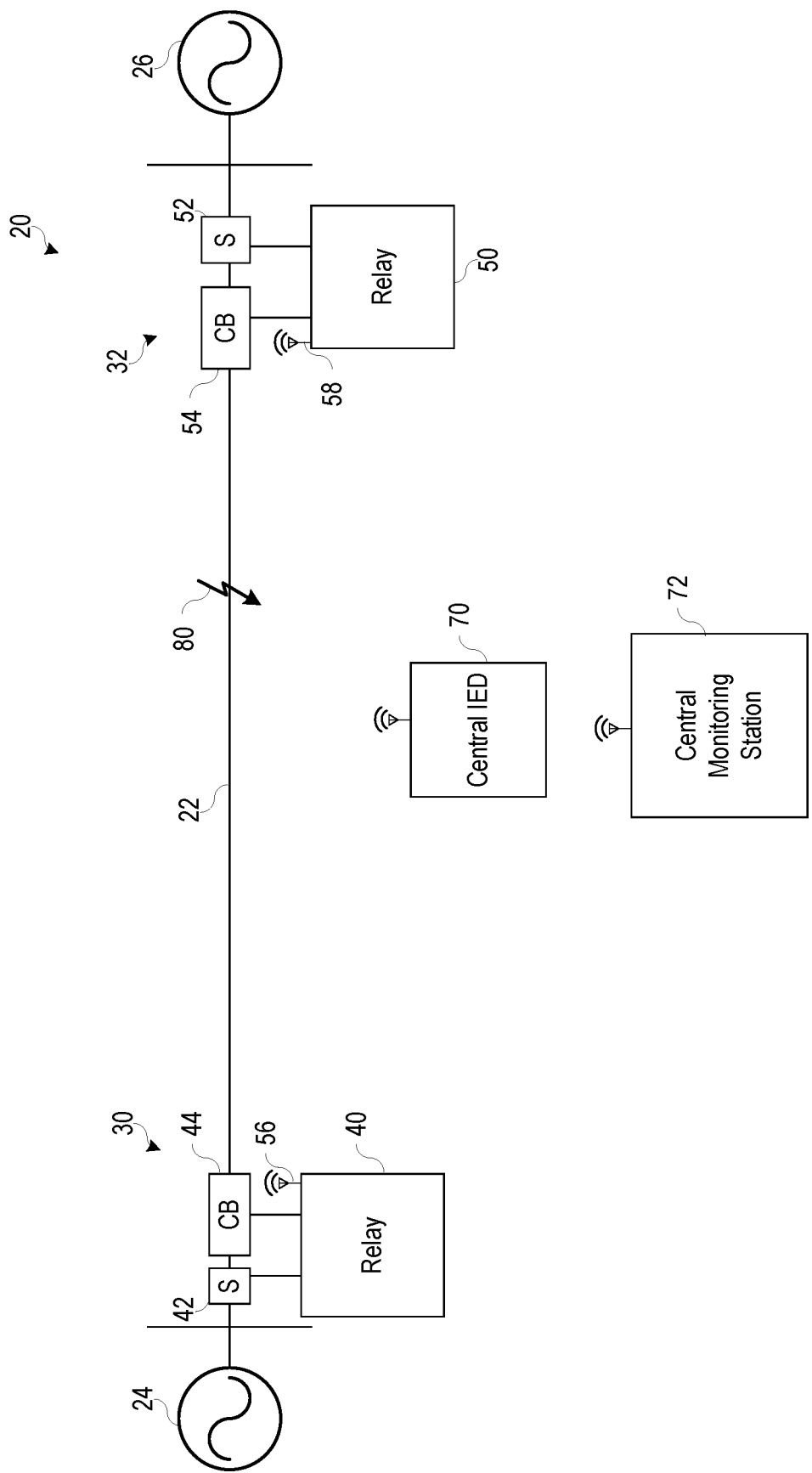
FIG. 1 illustrates a simplified one-line diagram of an electric power delivery system having a local relay and a remote relay that determine the location of a fault on a power line, in accordance with embodiments of the present disclosure.

FIG. 1 illustrates a one-line diagram of an electric power delivery system 20, in accordance with an embodiment. The electric power delivery system 20 may be any suitable electric power delivery system 20, such as a three-phase system. Although the one-line diagram is used as a simplified example, the systems and methods disclosed herein may be used in conjunction with any suitable power delivery system, such as a power transmission system, a power distribution system, radial power distribution systems, bi-directional power systems, or the like. The electric power delivery system 20 may be configured to generate, transmit, and distribute electric energy to loads. Electric power delivery systems may include equipment, such as electric generators, power transformers, power transmission and/or delivery lines, circuit breakers, busses, loads, and the like. A variety of other types of equipment may also be included in electric power delivery system 20, such as voltage regulators, capacitor banks, and a variety of other types of equipment. In the illustrated embodiment, the power delivery system 20 includes a power line 22 that transfers electrical energy from a first power generator 24 and a second power generator 26 to one or more loads.

The power delivery system 20 may be monitored, controlled, automated, and/or protected using protection systems 30 and 32. The protection systems 30 and 32 may each include one or more intelligent electronic devices (IEDs), such as a local relay 40 and a remote relay 50. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment. Note that, as used herein, the local relay may refer to the relay that is determining the location of the fault as a distance from that relay. Further, remote may refer to the relay that transmits data (e.g., current measurements and voltage measurements) to be used by the local relay in determining the location of the fault. That is, the remote relay may be any suitable distance from the local relay.

As used herein, an IED (such as local relay 40 and remote relay 50) may refer to any microprocessor-based device that monitors, controls, automates, and/or protects monitored equipment within the power delivery system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout the power delivery system 20. Utilizing a common or universal time source may enable the IEDs to have a synchronized time signal that can be used to generate time synchronized data. In various embodiments, relays 40 and 50 may receive a common time signal. The time signal may be distributed in the power delivery system 20 using a communications network or using a common time source, such as a Global Navigation Satellite System ("GNSS"), or the like.

According to various embodiments, the local relay 40 and the remote relay 50 may communicate, via communication circuitry 56 and 58, with each other, with one or more other IEDs 70, and/or with a central monitoring system 72. In some embodiments, the local relay 40 and the remote relay 50 may communicate with the IED 70 and/or the central monitoring station 72 directly or via a communication network. The central monitoring system 72 may include one or more of a variety of types of systems. For example, central monitoring system 72 may include a supervisory control and data acquisition (SCADA) system and/or a wide area control and situational awareness (WACSA) system. The IED 70 may be in communication with the local relay 40 and the remote relay 50. The local relay 40 and the remote relay 50 may communicate over various media such as direct communication or over a wide-area communications network.

Communication via network may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within the power delivery system 20.

As explained below, the local relay 40 and the remote relay 50 may monitor the electrical characteristics of the power on the power line 22 via sensor circuitry 42 and 52. Each of the local relay 40 and the remote relay 50 may be communicatively coupled to a respective circuit breaker 44 and 54. Upon occurrence of a fault 80, the local relay 40, the remote relay 50, the other IED 70, and/or the central monitoring station 72, may effect a control operation on the power delivery system 20, such as opening the local circuit breaker 44 or opening the remote circuit breaker 54.

Figure 2:
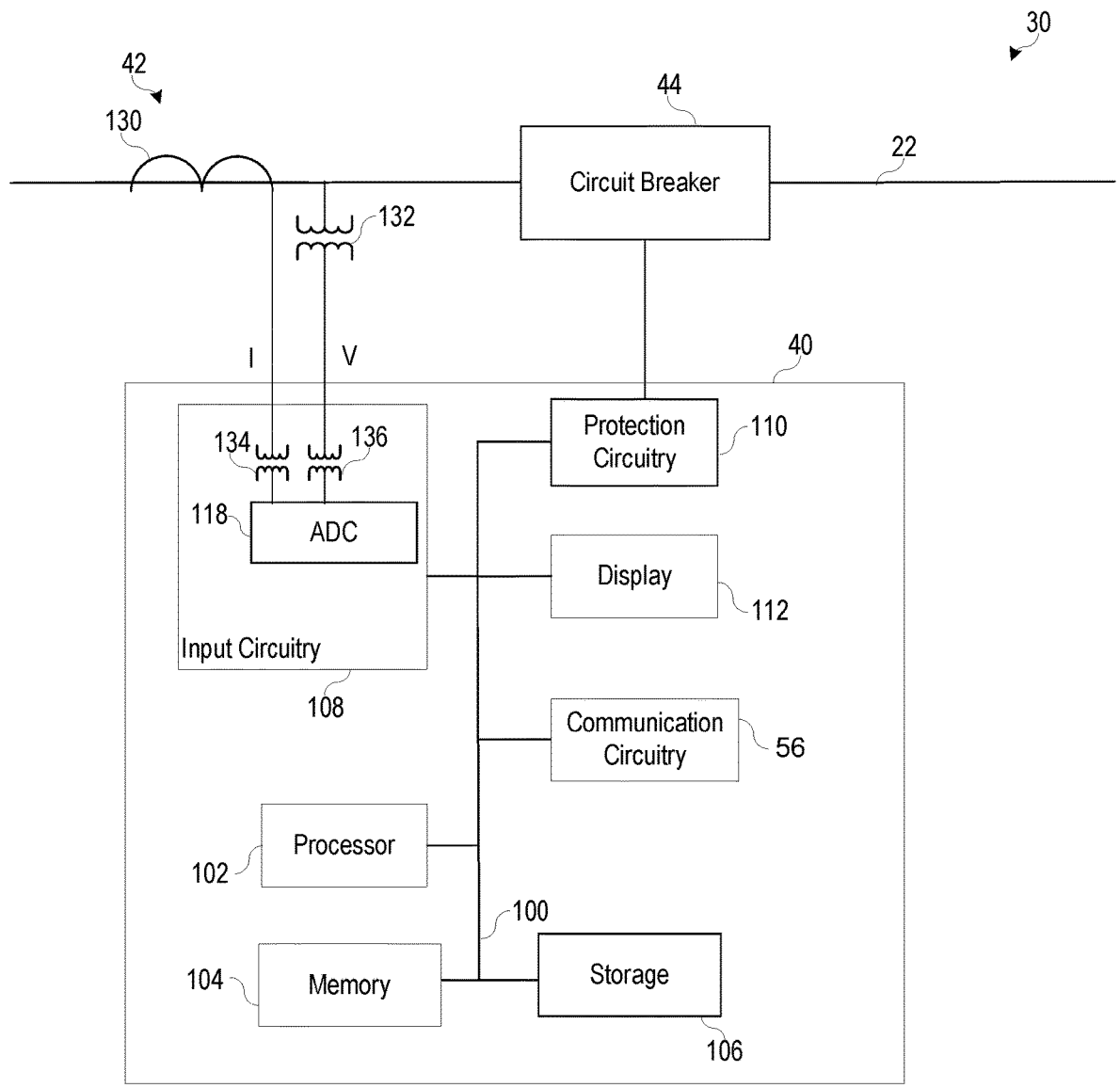
FIG. 2 is a block diagram of the local relay of FIG. 1, in accordance with embodiments of the present disclosure.

FIG. 2 illustrates a block diagram of the protection system 30 that may be used to determine a location of a fault and/or effect a control operation on the power delivery system 20. In the illustrated embodiment, the protection system 30 includes the relay 40, the sensor circuitry 42, and the circuit breaker 44. The relay 40 may include a bus 100 connecting a processor 102 or processing unit(s) to a memory 104, a computer-readable storage medium 106, input circuitry 108, protection circuitry 110, and one or more alarms 112. The computer-readable storage medium 106 may include or interface with software, hardware, or firmware modules for implementing various portions of the systems and methods described herein. The computer-readable storage medium 106 may be the repository of one or more modules and/or executable instructions configured to implement any of the processes described herein. In some embodiments, the computer-readable storage medium 106 and the modules therein may all be implemented as hardware components, such as via discrete electrical components, via a Field Programmable Gate Array ("FPGA"), and/or via one or more Application Specific Integrated Circuits ("ASICs").

The processor 102 may be configured to process inputs received via the input circuitry 108 and/or the communication circuitry 56. The processor 102 may operate using any number of processing rates and architectures. The processor 102 may be configured to perform various algorithms and calculations described herein using computer executable instructions stored on computer-readable storage medium 106. Processor 102 may be embodied as a microprocessor, a general purpose integrated circuit, an ASIC, a FPGA, and/or other programmable logic devices.

The sensor circuitry 42 may include a current transformer 130 and a potential transformer 132. The input circuitry 108 may receive electric current and voltage signals from the current transformer 130 and the voltage transformer 132 respectively, transform the signals using respective potential transformer(s) 134 and 136 to a level that may be sampled, and sample the signals using, for example, ND converter(s) 118 to produce digital signals representative of measured current and measured voltage on the power line. Similar values may also be received from other distributed controllers, station controllers, regional controllers, or centralized controllers. The values may be in a digital format or other format. In certain embodiments, the input circuitry 108 may be utilized to monitor current signals associated with a portion of an electric power delivery system 20. Further, the input circuitry 108 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 118 may be connected to the processor 102 by way of the bus 100, through which digitized representations of current and voltage signals may be transmitted to the processor 102. As described above, the processor 102 may be used to monitor and/or protect portions of the electric power delivery system 20, and issue control instructions in response to the same (e.g., instructions implementing protective actions). The processor 102 may determine a location of a fault on a power line 22 based on the digitized representations of the current and voltage signals.

The processor 108 may effect a control operation on the electric power delivery system 20 via the protection circuitry 110. For example, the processor 102 may send a signal to control operation of the circuit breaker 44 to disconnect the power line 22 from the generator 24. The relay 40 may include a display screen 112 to display the location of the fault to an operator. The communication circuitry 56 may include a transceiver to communicate with one or more other intelligent electronic devices and/or a central monitoring station, or the like. In some embodiments, the processor 102 may cause the transceiver to send a signal indicating the location of the fault. For example, the processor 102 may send, via the transceiver of the communication circuitry 56, a signal indicating the location of the fault to the central monitoring station 72. Further, the processor 102 may activate the alarms 112 upon detection of the fault.

Figure 3:
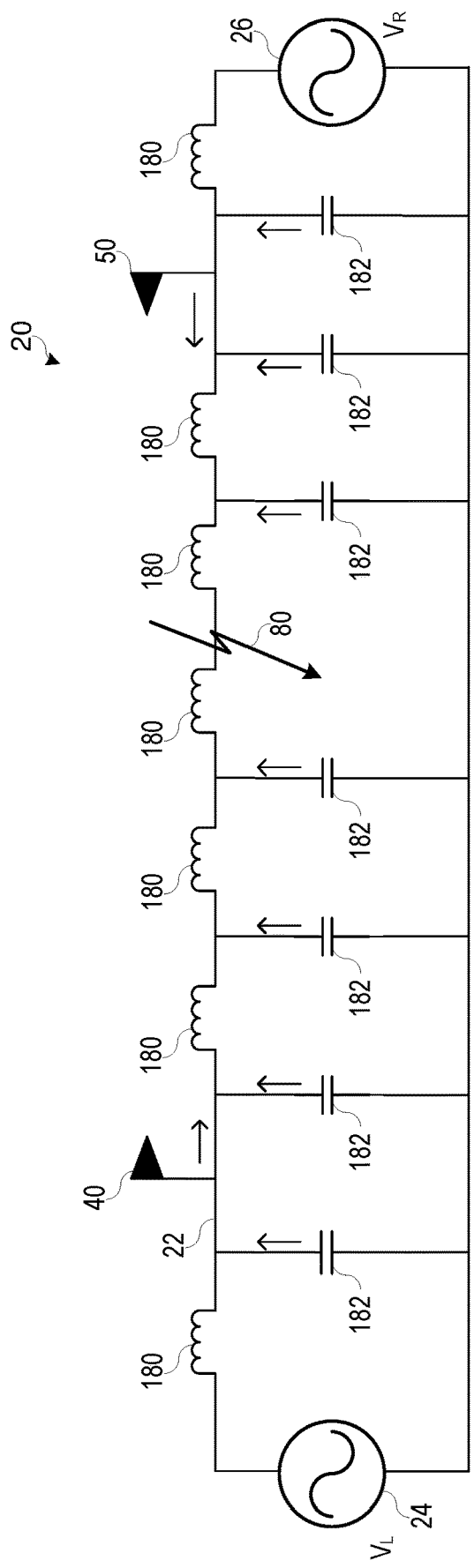
FIG. 3 is a single phase representation of the electric power delivery system of FIG. 1, in accordance with embodiments of the present disclosure.

FIG. 3 illustrates a single phase representation of the power delivery system 20 that includes the power line 22 electrically coupled between a local generator 24 and a remote generator 26. The local relay 40 is coupled to the power line 22 between the local generator 24 and the remote relay 50, and the remote relay 50 is coupled between the remote generator 26 and the local relay 40. The power line 22 has inductance and capacitance spread across the line due to the physical properties, referred to as line parameters, of the power line 22, such as the length of the power line 22, the proximity of the power line to other phase lines and/or to the ground, and the like. In the illustrated embodiment, inductance (e.g., parasitic inductance) across the power line 22 is represented by inductors 180, and capacitance (e.g., shunt capacitance) across the power line 22 is represented by capacitors 182.

Various techniques may be used by the local relay 40, the remote relay 50, or a combination of both, to determine a location of the fault 80. As described below, the fault 80 may be analyzed using symmetrical component analysis to determine the location of the fault 80 from the local relay 40 and/or the remote relay 50.

Figure 4:
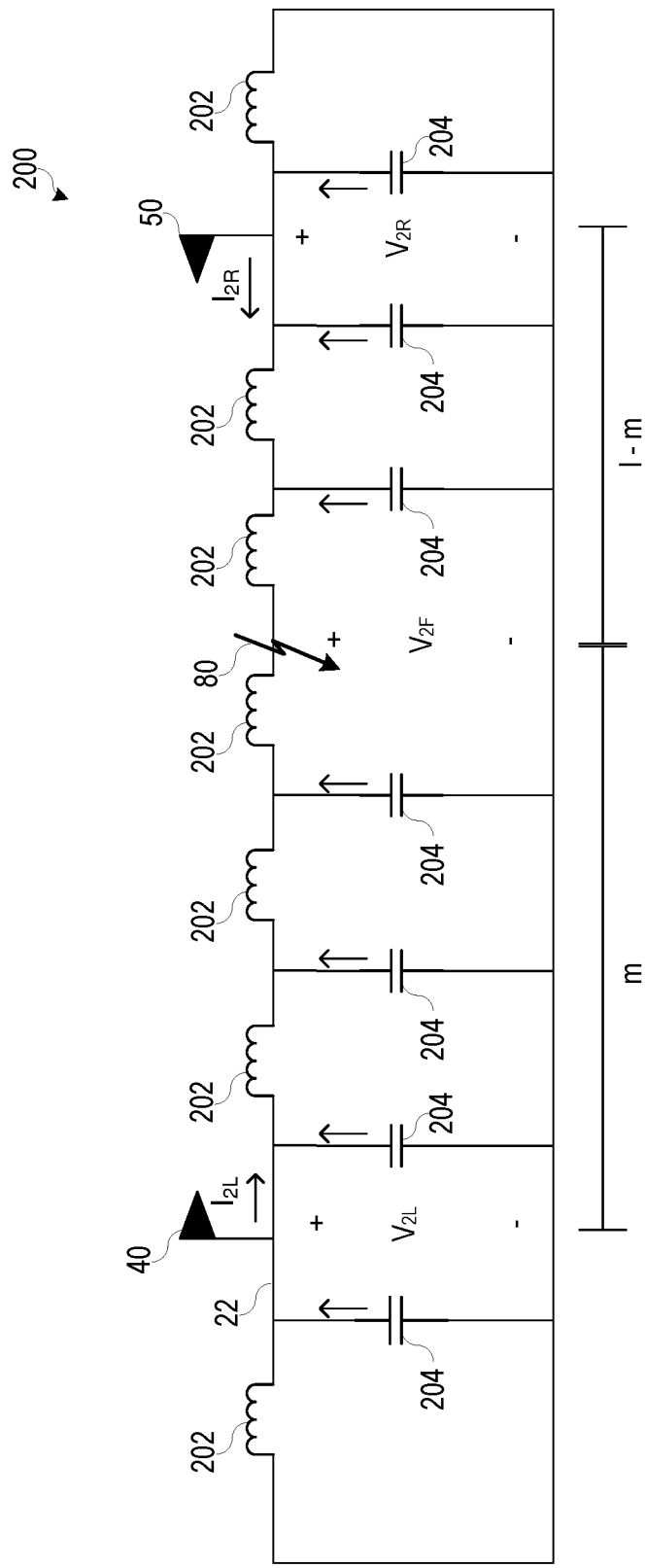
FIG. 4 is a circuit diagram of the negative sequence network of the electric power delivery system of FIG. 1, in accordance with embodiments of the present disclosure.

FIG. 4 is a circuit diagram of a negative sequence network 200 of the power delivery system 20 of FIG. 3 having the fault 80, such as an unbalanced fault. The negative sequence network 200 includes a negative sequence inductance and a negative sequence capacitance caused by the inductance and capacitance across the power line 22. The negative sequence inductance and the negative sequence capacitance are represented by inductors 202 and capacitors 204 in the circuit diagram.

A first technique, referred to as the impedance-based fault location technique, may determine the location of the fault using the negative sequence fault voltage and the negative sequence currents from the local and remote relays 40 and 50. In the illustrated embodiment, the expression for the fault voltage from the local relay 40 may be:

$$V_{2F}=V_{2L}-mZ_{1L}I_{2L} \qquad \text{Eq. 1}$$

where $V_{2F}$ is the negative sequence fault voltage detected from the local relay 40, $V_{2L}$ is the negative sequence voltage at the local relay 40, m is the location (i.e., per-unit distance) of the fault from the local relay 40, $V_{1L}$ is the positive sequence impedance of the power line 22 per unit length, and $I_{2L}$ is the negative sequence current measured at the local relay 40. Further, the expression for the fault voltage from the remote relay 50 may be:

$$V_{2F}=V_{2R}-(1-m)Z_{1d}I_{2R} \qquad \text{Eq. 2}$$

where $V_{2R}$ is the negative sequence voltage from the remote relay 50, m is the location of the fault from the local relay 40, $V_{1L}$ is the positive sequence impedance of the power line per unit length, and $I_{2R}$ is the negative sequence current measured at the remote relay 50. By equating equations (1) and (2), the fault location m (in miles or kilometers) can be expressed as:

$$m = \left[\frac{V_{2L} - V_{2R} + I_{2R}Z_{1L}l}{(I_{2L} + I_{2R})Z_{1L}}\right] \qquad \text{Eq. 3}$$

where l is the length of power line 22.

Figure 5:
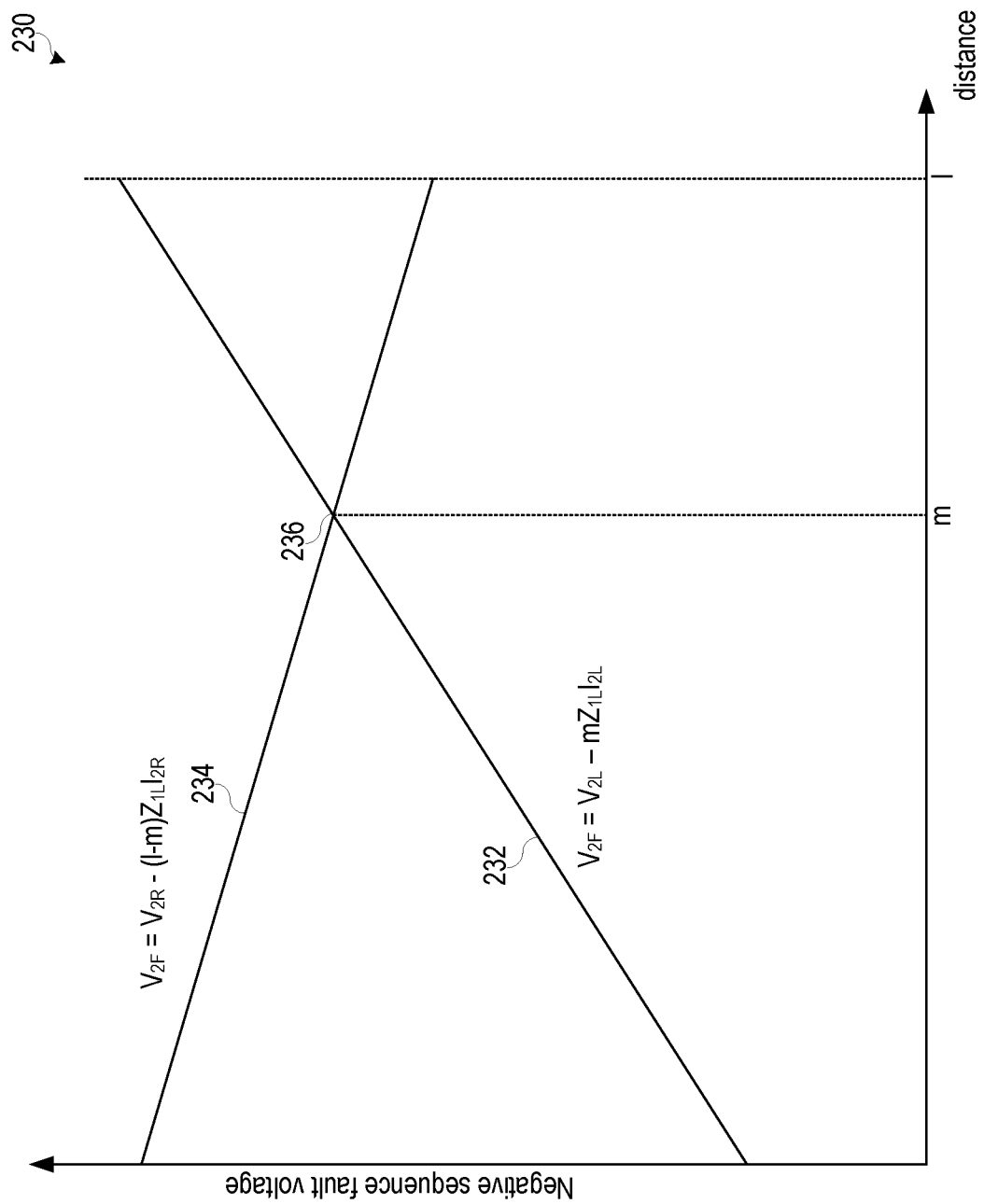
FIG. 5 is a plot of the negative sequence voltage with respect to distance on the power line of FIG. 1, in accordance with embodiments of the present disclosure.

FIG. 5 is a plot 230 of the expressions of equations (1) and (2) showing negative sequence voltages with respect to line length. In particular, a first line 232 is a plot of equation (1) based on the current and voltage measurements of the local relay 40. A second line 234 is a plot of equation (2) based on the current and voltage measurements of the remote relay 50. Using the impedance-based fault location technique, the location of the fault m may be determined as an intersection point 236 of the first line 232 and the second line 234.

However, this impedance-based fault location technique may not account for the capacitance on the power line. For example, the capacitance represented by the capacitors 182 of FIG. 3 may provide additional current delivered to the fault 80 that is not included in $I_{2L}$ and $I_{2R}$. Due to currents caused by the capacitance not accounted for in the impedance-based fault location calculation, an error in the location of the fault may occur. Further, the magnitude of the error may depend on the amount of capacitance across the power line 22 and to some extent on system impedance ratio, loading conditions, fault resistance, system non-homogeneity, etc. The errors in estimating the fault location using equation (3) can be reduced, if currents used in the equation are compensated for shunt capacitances using the pi equivalent model of distributed transmission lines. However, exact compensation cannot be determined as it is a function of negative sequence fault voltage and location of the fault, both of which are unknown. Thus, even if the shunt capacitance currents are compensated using the pi equivalent model of transmission lines, estimated fault locations are still prone to errors.

A second technique, referred to as the hyperbolic and/or exponential technique, may account for the shunt capacitance of the power line. According to a hyperbolic embodiment of the second technique, expression for the negative sequence fault voltage from the local relay 40 may be given by:

$$V_{2F}=V_{2L}\cosh[my_1]-I_{2L}Z_{c1}\sinh[my_1] \qquad \text{Eq. 4}$$

where $Z_{c1}$ is the positive sequence characteristic impedance of the power line 22, and $y_1$ is the positive sequence propagation constant. Further, the expression for the negative sequence fault voltage from the remote relay 50 may be given by:

$$V_{2F}=V_{2R}\cosh[(l-m)y_1]-I_{2R}Z_{c1}\sinh[(l-m)y_1] \qquad \text{Eq. 5}$$

Equating equations (4) and (5), the fault location m can be expressed as:

$$m = \frac{1}{\gamma_1}\tanh^{-1}\left(\frac{V_{2L} - V_{2R}\cosh(\gamma_1 l) + I_{2R}Z_{C1}\sinh(\gamma_1 l)}{I_{2L}Z_{C1} - V_{2R}\sinh(\gamma_1 l) + I_{2R}Z_{C1}\cosh(\gamma_1 l)}\right) \qquad \text{Eq. 6}$$

Note that the equation above includes the series expansion:

$$\tanh^{-1}x = x + \frac{x^3}{3} + \frac{x^5}{5} + \frac{x^7}{7} + \frac{x^9}{9} + \frac{x^{11}}{11}\ldots \qquad \text{Eq. 7}$$

where x is the values of equation (6) in the brackets. Likewise, according to an exponential embodiment of the second technique, the negative sequence fault voltage from the local relay may be expressed as:

$$V_{2F} = \left(\frac{V_{2L} - I_{2L}Z_{C1}}{2}\right)e^{m\gamma_1} + \left(\frac{V_{2L} + I_{2L}Z_{C1}}{2}\right)e^{-m\gamma_1} \qquad \text{Eq. 8}$$

Further, the negative sequence fault voltage from the remote relay may be expressed as:

$$V_{2F} = \left(\frac{V_{2R} - I_{2R}Z_{C1}}{2}\right)e^{(l-m)\gamma_1} + \left(\frac{V_{2R} + I_{2R}Z_{C1}}{2}\right)e^{-(l-m)\gamma_1} \quad \text{Eq. 9}$$

By equating equations (8) and (9), the location of the fault may be determined as:

$$m = \frac{1}{\gamma_1}\ln\sqrt{\frac{(V_{2R} - I_{2R}Z_{C1})e^{\gamma_1 l} - (V_{2L} + I_{2L}Z_{C1})}{(V_{2L} - I_{2L}Z_{C1}) - (V_{2R} + I_{2R}Z_{C1})e^{-\gamma_1 l}}} \quad \text{Eq. 10}$$

Note that the equation above includes the series expansion:

$$\ln(1+x) = x - \frac{x^2}{2} + \frac{x^3}{3} - \frac{x^4}{4} + \frac{x^5}{5} - \frac{x^6}{6}\ldots \quad \text{Eq. 11}$$

where x may be the value determined in equation (10) as:

$$x = \sqrt{\frac{(V_{2R} - I_{2R}Z_{C1})e^{\gamma_1 l} - (V_{2L} + I_{2L}Z_{C1})}{(V_{2L} - I_{2L}Z_{C1}) - (V_{2R} + I_{2R}Z_{C1})e^{-\gamma_1 l}}} - 1 \quad \text{Eq. 12}$$

Because of the series expansions in the hyperbolic and exponential embodiments of the second technique, calculating the location of the fault location using equation (6) and/or equation (10) may be computationally inefficient and/or more time-consuming because the function is non-linear. Due to the inaccuracies caused by not accounting for the shunt capacitance in the first technique, and due to the computationally time-consuming and slower operation of the second technique, a faster and more accurate method of determining fault locations is desired As explained above, impedance-based fault detection does not account for the capacitance 182 of the power line 22, thereby causing inaccuracies in the location determination. Further, hyperbolic equations may be computationally inefficient to calculate. As described below, the processor 102 may utilize a third technique to determine the location of the fault that may be calculated faster than the calculation using the hyperbolic equations but also accounts for the capacitance on the power line 22.

The third technique, referred to as the computationally efficient technique, improves IED technology by determining the location of a fault in a computationally efficient way while accounting for the shunt capacitance of a power line 22. That is, the computationally efficient method may improve IED technology by providing a more accurate location determination than the first technique and/or the second technique as well as a faster location determination than the second technique. Further, by incorporating one or more aspects of the computationally efficient technique in the IED may improve IED technology. As explained below, the local relay 40, the remote relay 50, or the other IED 70 may execute instructions to determine the location of the fault using the computationally efficient method. While the local relay 40 is described below in detail, this is meant to be illustrative and any suitable IED may be used to determine the location. Note that, while negative sequence profiles are used in embodiments described below, the corrected location of the fault may be similarly based on phase-domain quantity profiles, Clarke component profiles, symmetrical component quantity profiles, or any combination thereof.

Figure 6:
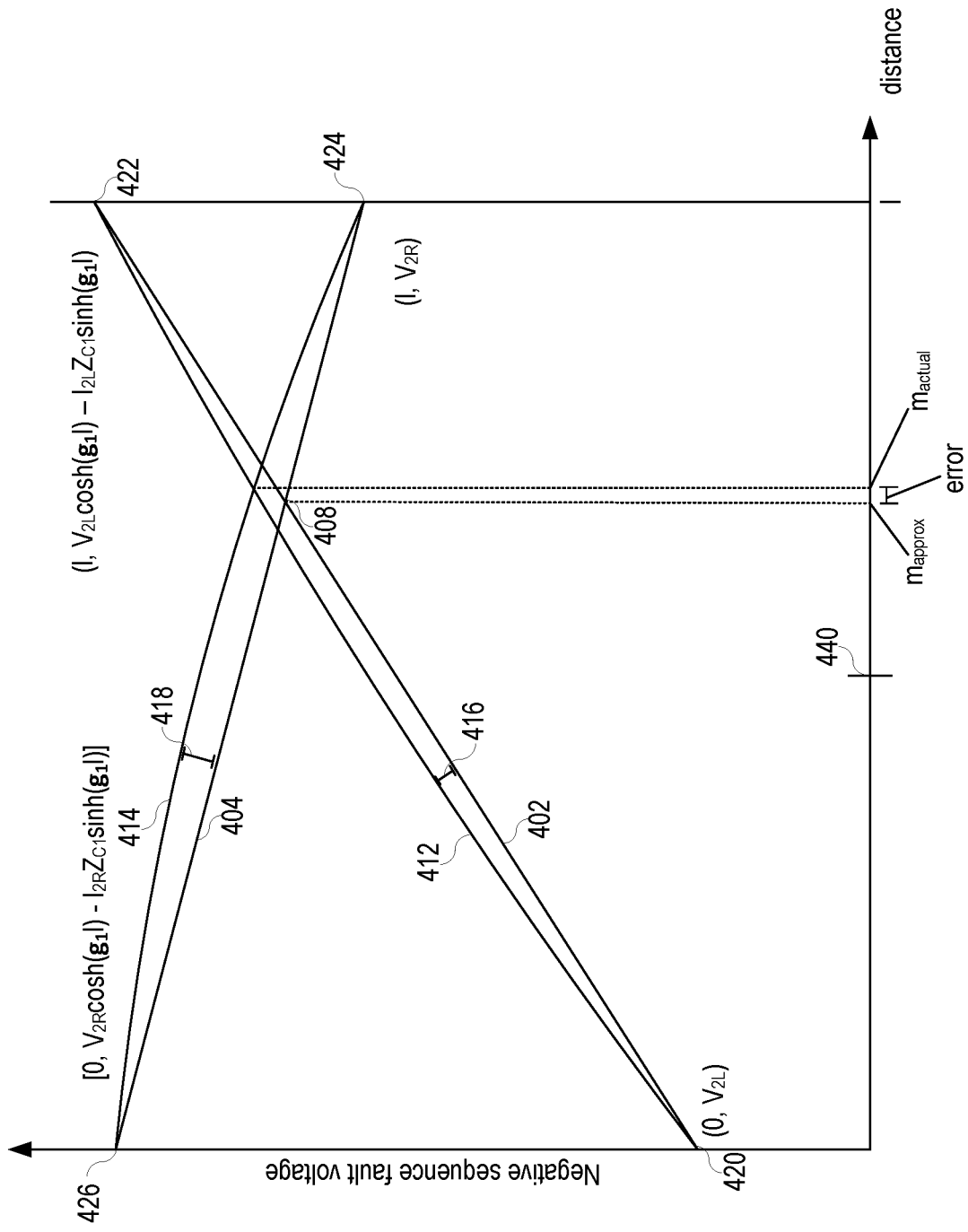
FIG. 6 is another plot of the negative sequence voltage with respect to distance on the power line of FIG. 1, in accordance with embodiments of the present disclosure.

FIG. 6 is a plot of negative sequence voltages from the local relay 40 and negative sequence voltages from the remote relay 50 with respect to distance. Although a visual plot is depicted in FIG. 6, this is meant to be illustrative and the processor 102 may perform the steps described herein based on the current measurements and voltage measurements without displaying such a plot. In the illustrated embodiment, a first negative sequence voltage profile 402 from measurements at the local relay 40 and a second negative sequence voltage profile 404 from measurements at the remote relay 50 are used to determine an approximate location of the fault. A third negative sequence voltage profile 412 represents negative sequence voltages with respect to corrected locations from the local relay 40 and a fourth negative sequence voltage profile 414 represents negative sequence voltages with respect to corrected locations from the remote relay 50. The corrected locations may provide improved locations of faults that account for line parameters, such as the shunt capacitance, of the power line 22.

From equation (4), the first negative sequence voltage profile 402 may include a first point 420 at the local relay (0, V2L) and, as measured from the local relay 40, a second point 422 of an estimate of what the negative sequence voltage is expected to be at the remote relay if the fault 80 occurred across the power line [I, V2Lcosh($\gamma_1$I)–I2LZC1sinh($\gamma_1$I)]. Likewise, from equation (5), the negative sequence voltage profile 404 may include a third point 424 at the remote relay (I, V2R) and, as measured from the remote relay 50, a fourth point 426 of an estimate of what the negative sequence voltage is expected to be at the local relay 50 if the fault 80 occurred across the power line [0, V2Rcosh($\gamma_1$I)–I2RZC1sinh($\gamma_1$I)]. These points may be referred to as end points (i.e., at each of the local relay 40 and the remote relay 50) of the hyperbolic characteristics of the power line 22. In the illustrated embodiment, the first voltage profile 402 and the second voltage profile 404 intersect at the approximate location ($m_{approx}$) of the fault. The processor 202 may calculate the location of the point of intersection 408 of the first negative sequence voltage profile 402 and the second negative sequence profile 404 using the end points such that:

$$m_{approx} = \frac{l}{1 + \frac{V_{2L}\cosh(\gamma_1 l) - I_{2L}Z_{C1}\sinh(\gamma_1 l) - V_{2R}}{V_{2R}\cosh(\gamma_1 l) - I_{2R}Z_{C1}\sinh(\gamma_1 l) - V_{2L}}} \quad \text{Eq. 13}$$

The approximate location of the fault may not completely account for the line parameters (e.g., shunt capacitance) of the power line 22. That is, using a straight line between the points of the first voltage profile 402 and a straight line between the two points of the second voltage profile 404 introduce an error (i.e., difference) between the actual location ($m_{actual}$) of the fault and the approximate location $m_{approx}$ of the fault. The error in determining the location of the fault location using the approximate location $M_{approx}$ may be introduced from a bend 416 and 418 in the third voltage profile 412 and the fourth voltage profile 414 due to the line parameters (e.g., shunt capacitance) of the power line 22. Depending on the line characteristics, the profiles may include more bend or less bend. For example, if the cable is underground, the shunt capacitance may be greater and cause a greater bend between the first voltage profile 402 and the third voltage profile 412 and a greater bend between the second voltage profile 404 and the fourth voltage profile 414, thereby causing a larger or smaller error between the approximate location and the actual location. Further, using the first voltage profile 402 and the second voltage profile 404 introduce a negative error when the point of intersection of the first voltage profile 402 and the second voltage profile 404 occurs between the local relay 40 and a midpoint 440. Similarly, using the first voltage profile 402 and the second voltage profile 404 introduce a positive error when the point of intersection of the first voltage profile 402 and the second voltage profile 404 occurs between the midpoint and the remote relay 50. The processor 102 may determine a correction factor to account for the difference between the approximate location of the fault and the actual location of the fault.

Figure 7:
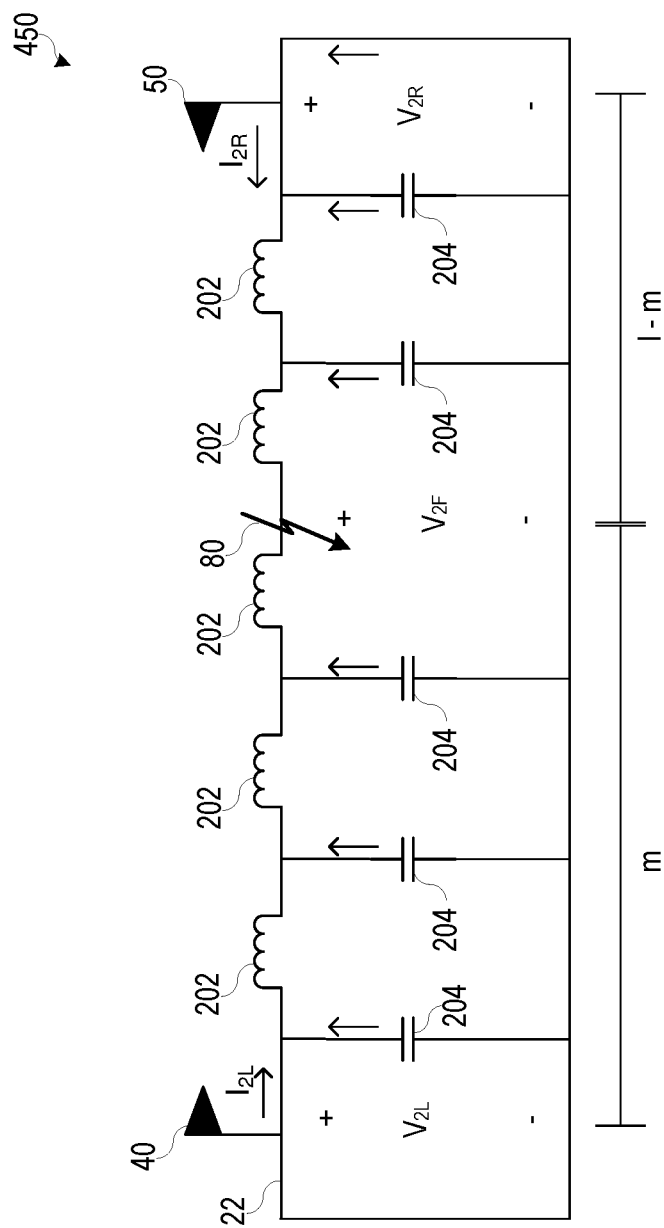
FIG. 7 is a simplified circuit diagram of the negative sequence network shown with infinite local and remote sources of FIG. 4, in accordance with embodiments of the present disclosure.

FIG. 7 is a simplified circuit diagram 450 of the negative sequence network of FIG. 4 that may be used in determining the corrected location of the fault using a correction factor. In the illustrated embodiment, the local generator 24 (not separately illustrated) and the remote generator 26 (not separately illustrated) are set to be infinite such that the local negative sequence voltage $V_{2L}$ at the local relay 40 and the remote negative sequence voltages $V_{2R}$ at the remote relay 50 are zero because the correction factor is a function of the line parameters (e.g., the line length, the inductance, the capacitance, etc.). In such embodiments, the processor 102 may determine the approximated fault location from equation (13) as:

$$m_{approx\_infinite\_sources} = \frac{l}{1 + \frac{I_{2L}}{I_{2R}}} \quad \text{Eq. 14}$$

Equating the negative sequence fault voltage from the local relay 40 and the remote relay 50 using hyperbolic equations may be expressed as:

$$V_{2L}\cosh(\gamma_1 m) - I_{2L}Z_{c1}\sin h(\gamma_1 m) = V_{2r}\cosh[\gamma_1(l-m)] - I_{2R}Z_{c1}\sinh[\gamma_1(l-m)] \quad \text{Eq. 15}$$

where $Z_{c1}$ is the positive sequence characteristic impedance of the power line 22. Since V2L=V2R=0, the equation (15) may be simplified to:

$$\frac{I_{2L}}{I_{2R}} = \frac{\sinh[(l-m)\gamma_1]}{\sinh(\gamma_1 m)} \quad \text{Eq. 16}$$

Further, by substituting equation (16) into equation (14), the approximate fault location with local and remote sources as infinite can be expressed as:

$$m_{approx\_infinite\_sources} = \frac{l}{1 + \frac{\sinh[(l-m)\gamma_1]}{\sinh(\gamma_1 m)}} \quad \text{Eq. 17}$$

The error in the fault location may be expressed as the difference between the actual fault location and the approximate fault location. Using equation (17) above, the fault location error may be:

$$\text{Correction Factor } (m_{error}) = m - \frac{l}{1 + \frac{\sinh[(l-m)\gamma_1]}{\sinh(\gamma_1 m)}} \quad \text{Eq. 18}$$

The fault location error may be used as a correction factor to apply to the approximate location to determine the corrected location. The correction factor may not depend of the electrical properties (e.g., current and voltage) of the fault. As such, the correction factor may be calculated prior to the occurrence of the fault. For example, the fault location error may be determined at various locations along the length of the power line during installation, maintenance, or normal operation.

The processor 102 may then determine the corrected location of the fault based on the approximate location of the fault and the correction factor. That is, the processor 102 may determine the corrected location of the fault using the equation:

$$m_{corrected} = \frac{l}{1 + \frac{V_{2L}\cosh(\gamma_1 l) - I_{2L}Z_{C1}\sinh(\gamma_1 l) - V_{2R}}{V_{2R}\cosh(\gamma_1 l) - I_{2R}Z_{C1}\sinh(\gamma_1 l) - V_{2L}}} + \text{Correction Factor}|_{m_{approx}} \quad \text{Eq. 19}$$

Figure 8:
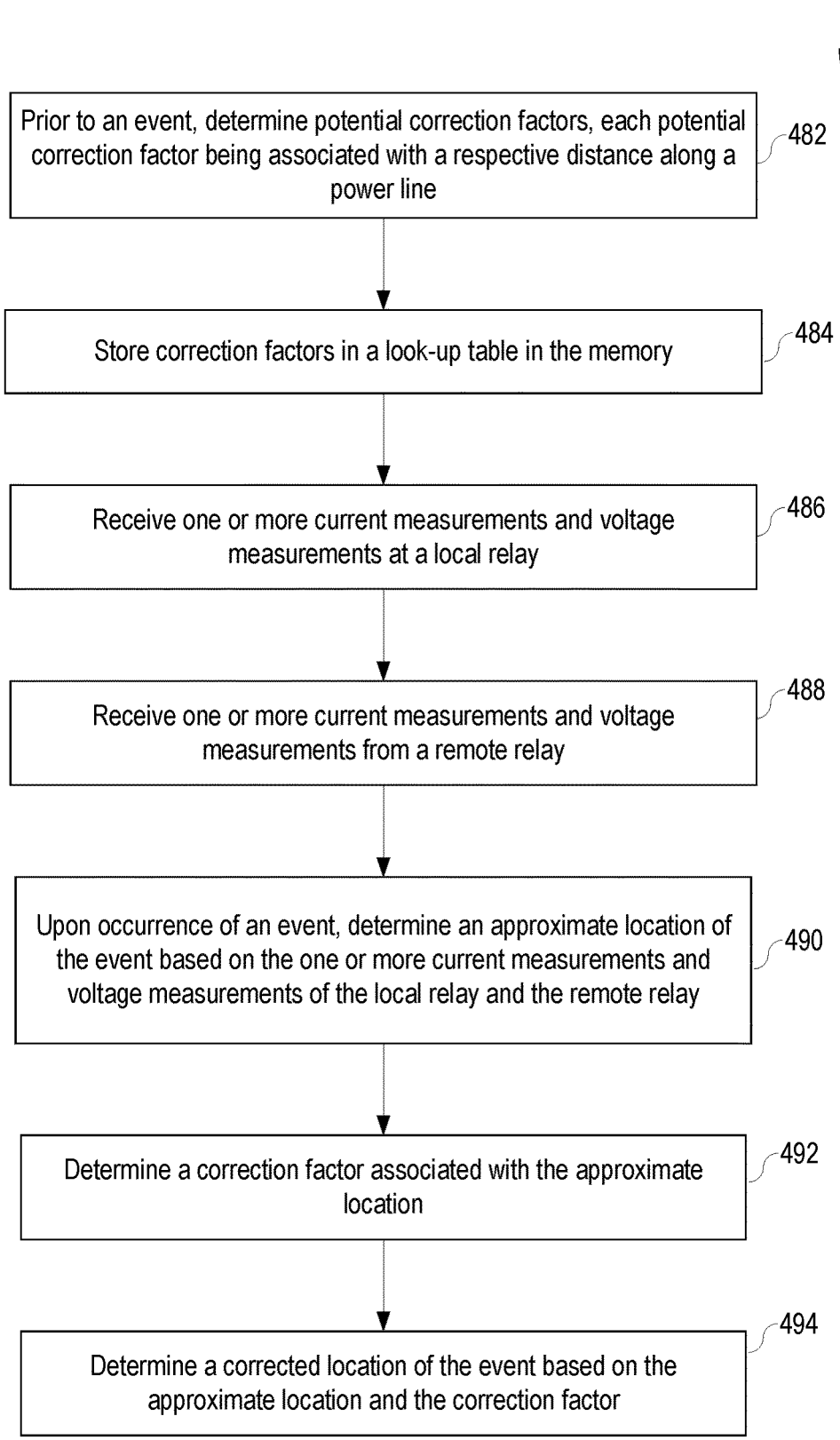
FIG. 8 is a flow diagram of a process performed by the local relay of FIG. 1, in accordance with embodiments of the present disclosure.

FIG. 8 is a flow chart of a process 480 to perform the computationally efficient technique via the local relay 40 of the power delivery system 20. Instructions to perform the process 480 may be stored in the memory 104 (e.g., code) of the local relay 40 and executed by the processor 102. While the process is described with respect to the local relay 40, the remote relay 50 or any other suitable IED may perform the process 480.

Prior to a fault, the processor 102 may determine a plurality of potential correction factors. Each of the potential correction factors may be associated with a respective location across the power line 22 between the local relay 40 and the remote relay 50 (block 482). For example, if the power line 22 were a certain number of miles, at each amount of distance, (e.g., 0.01 mile, 0.1 mile, 0.5 mile, 1 mile, 2 miles, 5 miles, at tower locations, or the like), the processor 102 may determine a respective potential correction factor at that location using equation (18). As equation (18) depends on line parameters but not on electrical properties of the fault (e.g., current, voltage), the processor 102 may establish the potential correction factors at each location (e.g., each mile has a respective correction factor) on the power line 22 prior to the occurrence of the fault. The processor 102 may then store the potential correction factors and the respective location associated with each correction factor in the memory 104 in a look-up table (block 484). In some embodiments, the correction factors may be determined via equations that relate the approximate locations to the correction factors.

In certain embodiments, the correctio n factors may be loaded into the memory 104 during commissioning. For example, signal(s) representing the correction factors and the associated approximate locations may be received via the communication circuitry 56 during an installation time of the relay. In some embodiments, the processor 102 may update the table upon detection of a change in configuration of the power line 22.

The sensor circuitry 42 may detect current and voltage of the power line 22. The local relay 40 may receive, via the input circuitry 108, one or more local current measurements of the detected current at the local relay 40 and one or more local voltage measurements of the detected voltage at the local relay 40 (block 486). The local relay 40 may receive, via the communication circuitry 56, signal(s) indicating one or more remote current measurements of the detected current and one or more remote voltage measurements of the detected voltage from the remote relay 50 (block 488). In the illustrated embodiment, the processor 102 may determine that a fault has occurred based on the one or more current measurements and/or the one or more voltage measurements at the local relay 40. While the illustrated embodiment is discussed as having one remote relay 40, the local relay 40 may receive remote measurements from one, two, three, or more remote relays in any suitable power delivery system. Further, the processor 102 may determine the corrected fault location using the remote measurements from each of the remote relays.

In some embodiments, the processor 102 may receive an indication that a fault has occurred from the remote relay 50 or the other IED 70. In certain embodiments, the processor 102 may receive remote current measurements and remote voltage measurements from the remote relay 50 indicative of the current and voltage on the power line 22 at the remote relay 50 and determine that a fault has occurred based on a combination of the local measurements and remote measurements.

Upon detecting the occurrence of the fault, the processor 102 may determine an approximate location of the fault based on the one or more current measurements and the one or more voltage measurements of the local relay 40 and the one or more current measurements and one or more voltage measurements of the remote relay 50 (block 490). The processor 102 may determine a point of intersection using the end points 420, 422, 424, and 426 of negative sequence voltages at the local relay 40 and the remote relay 50. Note that the line parameters, such as shunt capacitance currents, do not significantly affect the end points 420, 422, 424, and 426. For example, the processor 102 may determine the approximate location to be the intersection 408 of straight lines between the end points 420, 422, 424, and 426 using equation (13).

The processor 102 may then determine a correction factor associated with the approximate location (block 492). For example, the processor 102 may select, from the look-up table in the memory, the potential correction factor associated with the location in nearest proximity to the approximate location to use as the correction factor. In some embodiments, the determined correction factor may be linearly interpolated between the potential correction factors having locations adjacent to the approximate location.

The processor 102 may then determine a corrected location of the fault based on the approximate location and the correction factor (block 494). For example, the corrected fault location may be determined using equation (19).

The processor 102 may provide an indication of the corrected location of the fault. For example, the processor 102 may send, via the communication circuitry 56, the indication of the corrected location of the fault to the other IED 70 or the central monitoring station 72 to be displayed on a display screen of the central monitoring station 72.

In some embodiments, the processor 102 may control the protection circuitry 110 (e.g., operate the circuit breaker 44) based on the corrected location. By utilizing the computationally efficient technique, IED technology may be improved by determining locations of faults more efficiently and/or more accurately. In some embodiments, the processor 102 may send one or more signals to the display screen 112 on the IED 40 and/or remotely to the IED 70 to cause the display screen 112 to display the corrected location of the fault to allow a user to view the corrected location and to more quickly assess the fault at the corrected location.

In some embodiments, the processor 102 may compare the determined distance of the fault with a threshold. For example, the threshold may be associated with a zone of protection of the circuit breaker 44. The processor 102 may cause the IED to send a signal (e.g., via the protection circuitry 110) to trip the circuit breaker 44 when the determined distance to the fault falls within the zone of the circuit breaker based on the comparison to the threshold.

While a single terminal line is described in detail above, the methods and systems may also be applied in multi-terminal power lines. The process would involve receiving currents and voltages from each of the remote terminals at the local IED and, upon receiving the currents and voltages, applying appropriate equations based on the equations above at the local IED.

As explained above, IED technology may be improved by determining the fault location using the computationally efficient technique which may improve computational efficiency and/or accuracy as compared to other techniques. For example, IED technology, such as relays, may be improved by accounting for line parameters (e.g., shunt capacitance) of the power line to more accurately determine the location of the fault. Further, the computationally efficient technique may account for the line parameters without using series expansion. More particularly, by utilizing a correction factor, relay technology may more efficiently and accurately calculate the distance to the fault to enable the power line to be serviced and brought on-line faster, thereby improving the reliability of the power system. In some embodiments, by controlling operation of the circuit breaker based on improved fault location may improve reliability of the power system by more accurately removing the fault from the power system.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An intelligent electronic device (IED) configured to be positioned at a local end of a power line and to communicate with at least one other IED at a remote end of the power line, wherein the IED comprises:
communication circuitry configured to receive one or more signals representative of one or more remote current measurements and one or more remote voltage measurements on the power line from the at least one other IED, wherein the communication circuitry includes a transceiver;
a memory; and
a processor operatively coupled to the memory, wherein the processor is configured to:
receive one or more local current measurements and one or more local voltage measurements of the power line;
determine an approximate location of the fault based on the one or more remote current measurements, the one or more remote voltage measurements, the one or more local current measurements, and the one or more local voltage measurements, wherein the approximate location is determined as a point of intersection between a first voltage profile of the one or more local voltage measurements obtained at the local end at of the power line and a second voltage profile of the one or more remote voltage measurements obtained at the remote end of the power line;
determining a correction factor from a set of potential correction factors stored in the memory to account for the amount of distributed shunt capacitance throughout the power line;
determine a corrected location of the fault based on the approximate location of the fault and the correction factor; and
provide an indication of the corrected location of the fault.

2. The IED of claim 1, wherein the processor is configured to:
prior to the fault, determine the set of potential correction factors, wherein each potential correction factor is associated with a respective potential distance at which the fault may occur;
store the set of potential correction factors associated with the respective potential distance in a look-up table in the memory; and
upon occurrence of the fault, determine the correction factor by comparing, via the look-up table, the approximate location to the fault to at least one potential location.

3. The IED of claim 1, wherein the processor is configured to determine the approximate location of the fault using:
a negative sequence voltage value at the IED;
a negative sequence voltage value at the at least one other IED;
an estimated negative sequence voltage value at the IED using remote measurements had the fault occurred across a length of the power line; and
an estimated negative sequence voltage value at the at least one other IED using local measurements had the fault occurred across the length.

4. The IED of claim 1, wherein the approximate location comprises a point of intersection of a first negative sequence voltage profile of the IED as the first voltage profile and a second negative sequence voltage profile of the at least one other IED as the second voltage profile.

5. The IED of claim 1, wherein the processor is configured to determine the correction factor based on parameters of the power line to enable the IED to account for an error in the approximate location.

6. The IED of claim 1, wherein the processor is configured to provide the indication of the location of the fault to a central monitoring station to be displayed on a display of the central monitoring station.

7. The IED of claim 1, wherein the processor is configured to send one or more signals to a display screen of the IED to cause the display screen to display the corrected location of the fault.

8. The IED of claim 1, wherein the processor is configured to determine the approximate location of the fault using the equation:

$$m_{approx} = \frac{l}{1 + \frac{V_{2L}\cosh(\gamma_1 l) - I_{2L}Z_{C1}\sinh(\gamma_1 l) - V_{2R}}{V_{2R}\cosh(\gamma_1 l) - I_{2R}Z_{C1}\sinh(\gamma_1 l) - V_{2L}}}$$

where $m_{approx}$ is the approximate location of the fault from lines formed by the end points of hyperbolic characteristics of the power line, l is the length of the power line $V_{2L}$ is the negative sequence voltage measured at the IED, $I_{2L}$ is the negative sequence current measured at the IED, $Z_{C1}$ is the positive sequence characteristic impedance due to the capacitance of the power line, $V_{2R}$ is the negative sequence voltage measured from the at least one other IED, 12R is the negative sequence current measured at the at least one other IED, and γ is the propagation constant of the power line.

9. A non-transitory computer readable medium comprising instructions that, when executed by a processor, cause the processor to perform operations comprising:
acquiring, at a local relay, one or more local current measurements and one or more local voltage measurements;
acquiring, via communication circuitry of the local relay, one or more remote current measurements and one or more remote voltage measurements from a remote relay, wherein the communication circuitry includes a transceiver;
determining an approximate location of a fault based on the one or more local current measurements, the one or more local voltage measurements, the one or more remote current measurements, and the one or more remote voltage measurements, wherein the approximate location is determined as a point of intersection between a first voltage profile of the one or more local voltage measurements obtained at the local relay and a second voltage profile of the one or more remote voltage measurements obtained at the remote relay;
determining a correction factor from a set of potential correction factors stored in memory to account for the amount of distributed shunt capacitance throughout the power line;
determining a corrected location of the fault based on the approximate location of the fault and the correction factor; and
providing, via the local relay, an indication of the corrected location of the fault.

10. The non-transitory computer readable medium of claim 9, comprising instructions that cause the processor to select, via a look-up table of the set of potential correction factors associated with respective potential locations, the correction factor based on the approximate location compared to the potential locations.

11. The non-transitory computer readable medium of claim 9, comprising instructions that cause the processor to determine the approximate location of the fault using:
a negative sequence voltage value at the local relay;
a negative sequence voltage value at the remote relay;
an estimated negative sequence voltage value at the local relay using remote measurements had the fault occurred across a length of the power line; and
an estimated negative sequence voltage value at the remote relay using local measurements had the fault occurred across the length.

12. The non-transitory computer readable medium of claim 9, wherein the approximate location comprises a point of intersection of negative sequence voltages with respect to an IED and at least one other IED.

13. A method, comprising:
determining a plurality of potential correction factors associated with respective potential locations at which a fault may occur;
receiving, via communication circuitry of a local relay, one or more signals representative of one or more remote current measurements and one or more remote voltage measurements of a power line from a remote relay, wherein the communication circuitry includes a transceiver;
determining, via at least one processor, an approximate location in which the fault occurred on the power line based at least in part on:
one or more local current measurements from the local relay;
one or more local voltage measurements from the local relay;
one or more remote current measurements from the remote relay; and
one or more remote voltage measurements from the remote relay, wherein the approximate location of the fault does not account for shunt capacitance of the power line, wherein the approximate location is determined as a point of intersection between a first voltage profile of the one or more local voltage measurements obtained at the local relay and a second voltage profile of the one or more remote voltage measurements obtained at the remote relay;
determining a correction factor based on the plurality of potential correction factors to account for the amount of distributed shunt capacitance throughout the power line;
determining, via the at least one processor, a corrected location of the fault based on the correction factor and the approximate location; and
providing, via the at least one processor, an indication of the corrected location of the fault.

14. The method of claim 13, comprising, upon detecting the fault, sending one or more signals to a display screen to cause the display screen to display the corrected location of the fault.

15. The method of claim 13, wherein the first voltage profile comprises a negative sequence voltage value at the local relay and an estimated negative sequence voltage value at the local relay using remote measurements had the fault occurred across a length of the power line, and wherein the second voltage profile comprises a negative sequence voltage value at the remote relay and an estimated negative sequence voltage value at the remote relay using the one or more local current measurements and the one or more local voltage measurements had the fault occurred across the length.

16. The method of claim 13, comprising selecting, via a look-up table having the plurality of potential correction factors associated with the respective potential locations, the actual correction factor based on the approximate location compared to the potential locations.

17. The method of claim 16, wherein the correction factor selected is the potential correction factor associated with the potential location in nearest proximity to the approximate location.

18. The method of claim 13, comprising determining the corrected location of the fault based on the approximate location and the correction factor using at least one of phase-domain quantity profiles, Clarke component profiles, and symmetrical component quantity profiles.

19. The method of claim 13, comprising:
using negative sequence hyperbolic voltage profiles to determine the location of the fault if the fault is an unbalanced fault; and
using positive sequence hyperbolic voltage profiles to determine the location of the fault if the fault is a balanced fault.

20. The method of claim 13, comprising: determining, via at least one processor, the approximate location of the fault on a multi-terminal power line.

* * * * *